United States Patent
Iseki

(10) Patent No.: US 10,237,652 B2
(45) Date of Patent: Mar. 19, 2019

(54) VOLUME CONTROL APPARATUS, VOLUME CONTROL METHOD AND VOLUME CONTROL PROGRAM

(71) Applicant: PIONEER CORPORATION, Tokyo (JP)

(72) Inventor: Akihiro Iseki, Saitama (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 15/521,400

(22) PCT Filed: Oct. 24, 2014

(86) PCT No.: PCT/JP2014/078348
§ 371 (c)(1),
(2) Date: Apr. 24, 2017

(87) PCT Pub. No.: WO2016/063412
PCT Pub. Date: Apr. 28, 2016

(65) Prior Publication Data
US 2017/0311079 A1    Oct. 26, 2017

(51) Int. Cl.
*H04R 3/00* (2006.01)
*H04R 3/12* (2006.01)
(Continued)

(52) U.S. Cl.
CPC ............. *H04R 3/12* (2013.01); *G10K 11/178* (2013.01); *G10K 11/17827* (2018.01);
(Continued)

(58) Field of Classification Search
CPC . H04R 1/22; H04R 1/26; H04R 1/403; H04R 3/04; H04R 3/12; H04R 2499/13;
(Continued)

(56) References Cited

U.S. PATENT DOCUMENTS 3,783,192 A * 1/1974 Takahashi ................. H04S 3/02
                                                                381/21
4,308,424 A * 12/1981 Bice, Jr. .................... H04S 5/02
                                                                369/87
(Continued)

FOREIGN PATENT DOCUMENTS

JP    2006-226872    8/2006
JP    2011-151559    8/2011
(Continued)

OTHER PUBLICATIONS

International Search Report, PCT/JP2014/078348, dated Jan. 20, 2015.

*Primary Examiner* — Thang V Tran
(74) *Attorney, Agent, or Firm* — Young & Thompson

(57) ABSTRACT

A volume control device controls reproduced sound levels at the listening position set to the seat in the vehicle compartment, and gives the phase difference to an externally inputted sound signal, and supplies the sound signals to two speakers. Here, the phase difference is calculated, at a frequency lower than a predetermined frequency, for sound signals reproduced by the speakers in front of and behind the listening position. Also, the phase difference is calculated to make a reproduced sound level at the listening position smaller than the reproduced sound level when the sound signal is reproduced by either one of the pair of speakers. Preferably, the listening position includes two evaluation points, and the reproduced sound level at the listening position is a sum of the reproduced sound levels at the two evaluation points. Thus, the reproduced sound may become small at an arbitrary listening position in the acoustic space.

10 Claims, 11 Drawing Sheets

(51) Int. Cl.
*G10K 11/178* (2006.01)
*H03G 3/00* (2006.01)
*H04R 1/22* (2006.01)
*H04R 1/40* (2006.01)
*H04S 7/00* (2006.01)
*H03G 3/30* (2006.01)

(52) U.S. Cl.
CPC ............... *H03G 3/002* (2013.01); *H04R 1/22* (2013.01); *H04R 1/403* (2013.01); *H04S 7/302* (2013.01); *G10K 2210/12* (2013.01); *H03G 3/3005* (2013.01); *H04R 2499/13* (2013.01); *H04S 2400/13* (2013.01)

(58) Field of Classification Search
CPC ......... H04R 2430/03; H04R 5/02; H04S 3/00; H04S 1/00; H04S 2400/13; H04S 7/302; H04S 7/307; G10K 11/178; G10K 11/17827; G10K 2210/12; H03G 3/002; H03G 3/3005; G06F 3/11; G06F 3/16
See application file for complete search history.

(56) References Cited

U.S. PATENT DOCUMENTS

| | | | | |
|---|---|---|---|---|
| 5,740,253 | A * | 4/1998 | Takeuchi | H04S 1/002 381/1 |
| 9,503,817 | B2 | 11/2016 | Iseki et al. | |
| 2009/0304213 | A1* | 12/2009 | Cook | H04S 1/002 381/300 |
| 2010/0329489 | A1* | 12/2010 | Karaoguz | H04S 7/302 381/307 |
| 2011/0058684 | A1* | 3/2011 | Ohta | H04S 1/00 381/97 |
| 2015/0043746 | A1* | 2/2015 | Iseki | G06F 3/16 381/97 |
| 2016/0014505 | A1 | 1/2016 | Iseki et al. | |

FOREIGN PATENT DOCUMENTS

| | | |
|---|---|---|
| JP | 4757034 | 8/2011 |
| WO | WO 2009/144781 | 12/2009 |
| WO | WO 2013/145127 | 10/2013 |
| WO | 2014/125581 A1 | 8/2014 |

\* cited by examiner

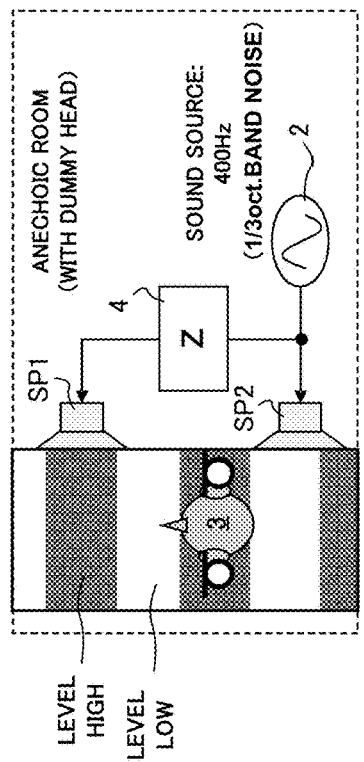

- PHASE SHIFT AMOUNT
  $A \text{ [s]} = (dF-dR)/c + 1/f \times 1/2$ $f$: FREQUENCY OF REPRODUCED SOUND
  $dF$: DISTANCE FROM spF TO LISTENER
  $dR$: DISTANCE FROM spR TO LISTENER
  $c$: SOUND VELOCITY ($\fallingdotseq 340\text{[m/s]}$)

- ALLOWABLE RANGE OF PHASE DIFFERENCE $\theta$:
  $A - 60° < \theta < A + 60°$

UPPER LIMIT FREQUENCY OF
CONTROLLED BAND : fu [Hz]

$$fu = c/dW/3/(|\cos\theta F + \cos\theta R|)$$

c : SOUND VELOCITY (≒340[m/s])
dW : WIDTH OF EAR POSITIONS (EAR WIDTH)

(INTERFERENCE FRINGES WHEN f=333Hz)

VOLUME CONTROL APPARATUS, VOLUME CONTROL METHOD AND VOLUME CONTROL PROGRAM

TECHNICAL FIELD

The present invention relates to a technique of adjusting a level of sound that a listener listens to in an acoustic space such as a vehicle compartment.

BACKGROUND TECHNIQUE

There is proposed a technique of adjusting a sound pressure level of reproduced sound in an acoustic space such as a vehicle compartment. For example, Patent Reference 1 proposes a technique of correcting a level of reproduced sound at each frequency band by an equalizer thereby to adjust the sound pressure level in accordance with the acoustic space and a listening position. Also, Patent Reference 2 proposes a method of arranging a speaker array including a plurality of speakers and controlling a phase and a sound volume of a sound signal outputted by each speaker, thereby to create a high sound pressure area at a certain position.

Further, Patent References 3 and 4 disclose methods of adjusting the level of sound reproduced by speakers arranged in front of and behind a listening position in an acoustic space.

PRIOR ART REFERENCES

Patent References

Patent Reference 1: Japanese Patent No. 4757034
Patent Reference 2: Japanese Patent Application Laid-open under No. 2011-151559
Patent Reference 3: International Publication WO2009/144781
Patent Reference 4: International Publication WO2013/145127

DISCLOSURE OF INVENTION

Problem to be Solved by the Invention

There is a case where people who want to listen to music and who do not want to listen to music are in the same vehicle compartment. For example, when the passengers include a baby or a child, it may be desired to keep their seats quiet. Now, it is supposed that the volume at the assistant driver's seat needs to be small in a vehicle compartment in which the speakers are arranged in front of and behind the driver's seat and the assistant driver's seat. In this case, if the volume of the front and rear speakers are reduced by the method of Patent Reference 1 or the like, the assistant driver's seat becomes quiet, but it becomes difficult to hear the sound at the rear seats. On the other hand, if the volume of only the rear speakers is increased, it becomes easy to hear the sound at the rear seats, but it becomes difficult to sufficiently keep the assistant driver's seat quiet because the sound from the rear speakers reaches the assistant driver's seat.

It is conceivable to reduce the sound pressure around the assistant driver's seat by using a speaker array, like Patent Reference 2. However, the method of Patent Reference 2 does not fit a vehicle because it needs a large system to control a plurality of speakers.

While it is conceivable to arrange separate speakers at the positions near the ears of each passenger in the vehicle compartment, the arrangement of the speakers becomes special. Additionally, even in that case, the low frequency component of the reproduced sound can reach other seats.

The above is one example of a problem to be solved by the present invention. It is an object of the present invention to provide a volume control device capable of decreasing the reproduced sound level at a certain listening position without giving affecting the environment and without requiring a large system.

Means for Solving the Problem

One invention described in claims is a volume control device connected to a pair of speakers arranged in front of and behind a listening position in an acoustic space, comprising: a calculation unit configured to calculate a phase difference, at a frequency lower than a predetermined frequency, between a sound signal reproduced by the speaker in front of the listening position and a sound signal reproduced by the speaker behind the listening position to make a reproduced sound level at the listening position smaller than the reproduced sound level when the sound signal is reproduced by either one of the pair of speakers; and a phase controller configured to control a frequency of the sound signal based on the phase difference and supplies the sound signals to the pair of speakers.

Another invention described in claims is a volume control method executed by a volume control device connected to a pair of speakers arranged in front of and behind a listening position in an acoustic space, comprising: a calculation process configured to calculate a phase difference, at a frequency lower than a predetermined frequency, between a sound signal reproduced by the speaker in front of the listening position and the sound signal reproduced by the speaker behind the listening position to make a reproduced sound level at the listening position smaller than the reproduced sound level when the sound signal is reproduced by either one of the pair of speakers; and a phase control process configured to control a frequency of the sound signal based on the phase difference and supplies the sound signal to the pair of speakers.

Still another invention described in claims is a volume control program executed by a volume control device connected to a pair of speakers arranged in front of and behind a listening position in an acoustic space and including a computer, the program makes the computer function as: a calculation unit configured to calculate a phase difference, at a frequency lower than a predetermined frequency, between a sound signal reproduced by the speaker in front of the listening position and the sound signal reproduced by the speaker behind the listening position to make a reproduced sound level at the listening position smaller than the reproduced sound level when the sound signal is reproduced by either one of the pair of speakers; and a phase controller configured to control a frequency of the sound signal based on the phase difference and supplies the sound signal to the pair of speakers.

BRIEF DESCRIPTION OF THE DRAWINGS

FIGS. 2A and 2B illustrate a method of giving a phase difference to signals supplied to two speakers.

FORMS TO EXERCISE THE INVENTION

Figure 1:
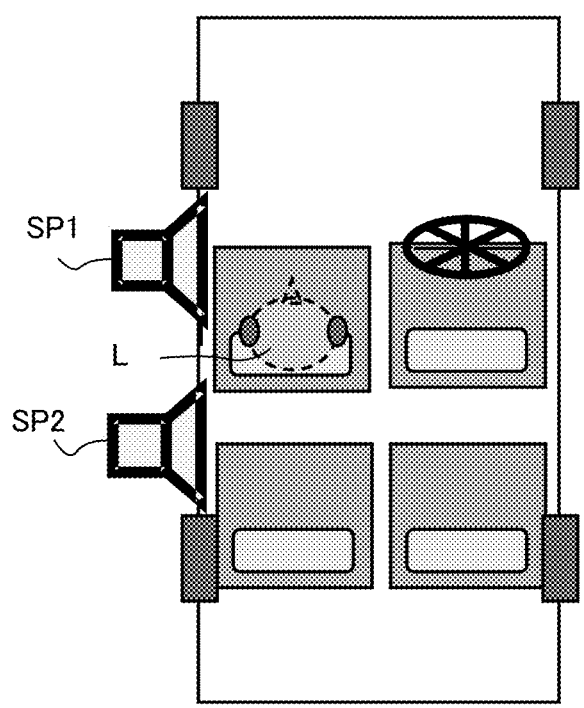
FIG. 1 is a plan view schematically illustrating an environment in a vehicle compartment.

According to one aspect of the present invention, there is provided a volume control device connected to a pair of speakers arranged in front of and behind a listening position in an acoustic space, comprising: a calculation unit configured to calculate a phase difference, at a frequency lower than a predetermined frequency, between a sound signal reproduced by the speaker in front of the listening position and a sound signal reproduced by the speaker behind the listening position to make a reproduced sound level at the listening position smaller than the reproduced sound level when the sound signal is reproduced by either one of the pair of speakers; and a phase controller configured to control a frequency of the sound signal based on the phase difference and supplies the sound signals to the pair of speakers.

The above volume control device is applicable to an acoustic space in a vehicle compartment for example, and controls reproduced sound levels at the listening position set to the seat in the vehicle compartment. Specifically, the volume control device gives the phase difference to the sound signal inputted from external, and supplies the sound signals to the pair of speakers. Here, the phase difference is calculated, at a frequency lower than a predetermined frequency, for a sound signal reproduced by the speaker in front of the listening position and a sound signal reproduced by the speaker behind the listening position. Also, the phase difference is calculated to make a reproduced sound level at the listening position smaller than the reproduced sound level when the sound signal is reproduced by either one of the pair of speakers. Preferably, the listening position includes two evaluation points, and the reproduced sound level at the listening position is a sum of the reproduced sound levels at the two evaluation points. Thus, the reproduced sound may become small at an arbitrary listening position in the acoustic space.

In one mode of the above volume control device, the predetermined frequency fu is given by:

$$fu = c/dW/3/(|\cos\theta F + \cos\theta R|),$$

wherein "dW" is a distance between the two evaluation points, "θF" is an angle formed by a line segment connecting a center of the two evaluation points and the speaker in front of the listening position and a line segment connecting the two evaluation points, "θR" is an angle formed by a line segment connecting the center of the two evaluation points and the speaker behind the listening position and the line segment connecting the two evaluation points, and "c" is a sound velocity. In a preferred example in this case, the predetermined frequency is 333 Hz.

In another mode of the above volume control device, the phase controller gives, to the sound signal, the phase difference within ±60° from the phase at which a sum of the reproduced sound levels becomes minimum. By setting the phase difference to this range, it becomes possible to make the reproduced sound level at the listening position smaller than the reproduced sound level when the sound signal is reproduced by either one of the pair of speakers.

In still another mode of the volume control device, the calculation unit calculates the phase difference based on a distance between the listening position and positions of the pair of speakers. Thus, it becomes possible to calculate an appropriate phase difference in accordance with the arrangement of the listening position and the pair of speakers.

According to another aspect of the present invention, there is provided a volume control method executed by a volume control device connected to a pair of speakers arranged in front of and behind a listening position in an acoustic space, comprising: a calculation process configured to calculate a phase difference, at a frequency lower than a predetermined frequency, between a sound signal reproduced by the speaker in front of the listening position and a sound signal reproduced by the speaker behind the listening position to make a reproduced sound level at the listening position smaller than the reproduced sound level when the sound signal is reproduced by either one of the pair of speakers; and a phase control process configured to control a frequency of the sound signal based on the phase difference and supplies the sound signal to the pair of speakers. By this method, the reproduced sound may become small at an arbitrary listening position in the acoustic space.

According to still another aspect of the present invention, there is provided a volume control program executed by a volume control device connected to a pair of speakers arranged in front of and behind a listening position in an acoustic space and including a computer, the program makes the computer function as : a calculation unit configured to calculate a phase difference, at a frequency lower than a predetermined frequency, between a sound signal reproduced by the speaker in front of the listening position and a sound signal reproduced by the speaker behind the listening position to make a reproduced sound level at the listening position smaller than the reproduced sound level when the sound signal is reproduced by either one of the pair of speakers; and a phase controller configured to control a frequency of the sound signal based on the phase difference and supplies the sound signal to the pair of speakers. By executing this program with the computer, the above volume control device can be realized. This program may be handled in a manner stored in a storage medium.

Embodiments

[Basic Principle]

First, a basic principle of the preferred embodiments will be described. The embodiments aim to decrease the sound pressure level at a specific position in an acoustic space such as a vehicle compartment, for example, at the assistant driver's seat. For that purpose, the embodiments utilize a special environment in a vehicle compartment.

FIG. 1 is a plan view schematically showing an environment in a vehicle according to the embodiments. In FIG. 1, there are four seats in the vehicle. A listener L is seated at the assistant driver's seat corresponding to a listening position. Here, on the left side of the assistant driver's seat, a front speaker SP1 and a rear speaker SP2 are arranged. While a front speaker and a rear speaker are similarly arranged on the right side of the vehicle in an actual vehicle, the illustration thereof is omitted here.

As shown in FIG. 1, the embodiments utilize such a special environment of the vehicle that two speakers SP1 and SP2 are arranged at the front side and the rear side in a manner sandwiching the assistant driver's seat. In the embodiments, the sound pressure levels at the left and right ears of the listener L are simultaneously controlled so as to keep the assistant driver's seat quiet, i.e., so that the listener L at the assistant driver's seat hardly hears the reproduced sound.

Generally, the magnitude of the sound perceived by a human being is determined based on a value obtained by summing up the sound intensity at both ears. Namely, a human being perceives the sound of same magnitude when he or she listens to the sound of sound pressure 6 dB by both ears and when he or she listens to the sound of sound pressure 12 dB by one ear. This is pointed out in the following document.

Reference: Hisao Sakai, Takeshi Nakajima, "Hearing and Acoustic Psychology", Corona Publishing, CO., LTD., pp.173-174, "The sound magnitude listened by both ears is equal to the sound magnitude when the sound pressure levels to both ears are increased by 6 dB and listened by one ear".

Therefore, in the embodiments, the positions of left and right ears of the listener L are set to evaluation points, respectively, and the signals inputted to the speakers SP1 and SP2 are controlled such that the sum of the sound pressure levels at those two evaluation points becomes small. Thus, the listener L feels the reproduced sound small.

FIGS. 2A and 2B schematically show a method of giving a phase difference to the sound signals supplied to two speakers SP1 and SP2. FIG. 2A shows a configuration for supplying sound signals to two speakers SP1 and SP2. In an anechoic room, a dummy head 3 is arranged at the listening position, and a front speaker SP1 and a rear speaker SP2 are arranged in front of and behind the dummy head 3 on the right side. The sound signal from the sound source 2 is inputted to the rear speaker SP2 as it is and inputted to the front speaker SP1 after being delayed by a fixed delay amount "Z" in an entire frequency band by the delay 4.

As shown in FIG. 2A, in a case where a pair of speakers are arranged in a longitudinal direction, the sound pressure distribution of the reproduced sound outputted by the speakers has lateral stripes due to interference. Specifically, in FIG. 2A, the black areas including the position of the dummy head 3 have the large sound pressure level, and the white areas have the small sound pressure level, thus forming the lateral stripes. Therefore, by varying the delay amount Z, it is possible to vary the levels of both ears synchronously to control the both-ear level sum.

FIG. 2B shows the examples of the sound pressure distribution around the dummy head 3 when the delay amount Z is varied. The value of the contour line indicates the sound pressure level. In the example shown in FIG. 2B, when the delay amount Z=0.8 [ms], the sound pressure level near the both ears of the dummy head 3 becomes a negative value. Therefore, in this example, the both-ear level sum becomes small when the delay amount Z=0.8 [ms].

In this way, by arranging a pair of speakers in front of and behind the position of the listener and giving an appropriate phase difference to the sound signals supplied to those speakers, the both-ear level sum of the listener can be decreased.

[1st Embodiment]

Figure 3A:
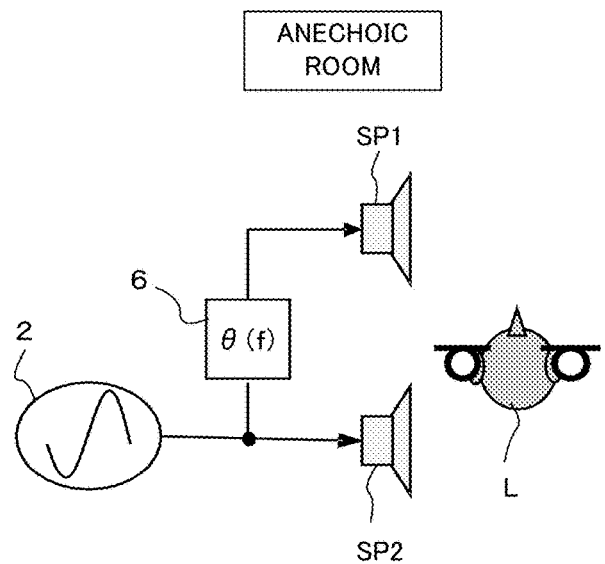
FIGS. 3A and 3B illustrate schematic configuration of a first embodiment of a volume control device according to the present invention.

FIG. 3A shows a schematic configuration of a volume control device according to a first embodiment. In the first embodiment, it is supposed that the acoustic space is an anechoic room.

As shown in FIG. 3A, a pair of speakers, i.e., a front speaker SP1 and a rear speaker SP2, are arranged in front of and behind the listening position of the listener L. In this example, the front speaker SP1 is farther than the rear speaker SP2 from the listener L.

The sound signal outputted by the sound source 2 is supplied to the rear speaker SP2 as it is, and is supplied to the front speaker SP1 after its phase is corrected by the phase correction unit 6. The phase correction unit 6 gives the phase difference (phase correction value) $\theta$ (f), different for each frequency band, to the sound signal outputted by the sound source 2. The phase difference $\theta$ (f) is determined such that the both-ear level sum of the listener L becomes small. It is noted that the positions of the left and right ears of the listener L correspond to two evaluation points.

Figure 4:
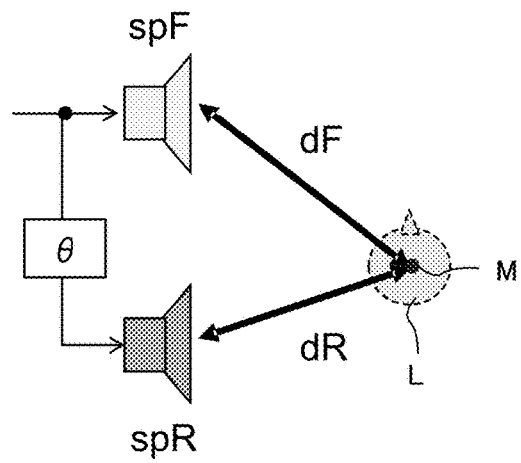
FIG. 4 illustrates an example of a method of calculating a phase shift amount.

FIG. 4 is a diagram for explaining a method of determining the phase difference $\theta$ (f). The phase difference $\theta$ (f) can be determined based on the distances between the positions of both ears of the listener L and the front and rear speakers spF and spR. Here, for simplicity, a center point of the head, i.e., the center point M of the left and right ears is supposed to be the evaluation point. Now, if the distance from the center point of the left and right ears, i.e., the center point M of two evaluation points to the front speaker spF is expressed as "dF" and the distance from the center point M to the rear speaker spR is expressed as "dR", an ideal phase shift amount A is given by the following equation.

$$A[s]=(dF-dR)/c+1/f \times 1/2 \quad (1)$$

Here, "f" is the frequency of the reproduced sound, and "c" is the sound velocity (approximately 340 [m/s]).

The first term of the equation (1) is a value for correcting the distance difference from the center point M to the front and rear speakers, and the second term is a value corresponding to a half period (half wavelength) of the reproduced sound. Namely, an ideal phase shift amount A is given to correct the distance difference to the front and rear speakers, and the reproduced sound is shifted by the half period to make the reproduced sounds from the front and rear speakers at the evaluation point cancel with each other. Thus, the sum of the reproduced sound level at the evaluation point can be minimized.

Additionally, the phase difference $\theta$ (f) is set by using the phase shift amount A as follows:

$$\theta (f)=A+\alpha \quad (2)$$

Here, "$\alpha$" is a value in the following range:

$$-60° < \alpha < 60° \quad (3)$$

Figure 5:
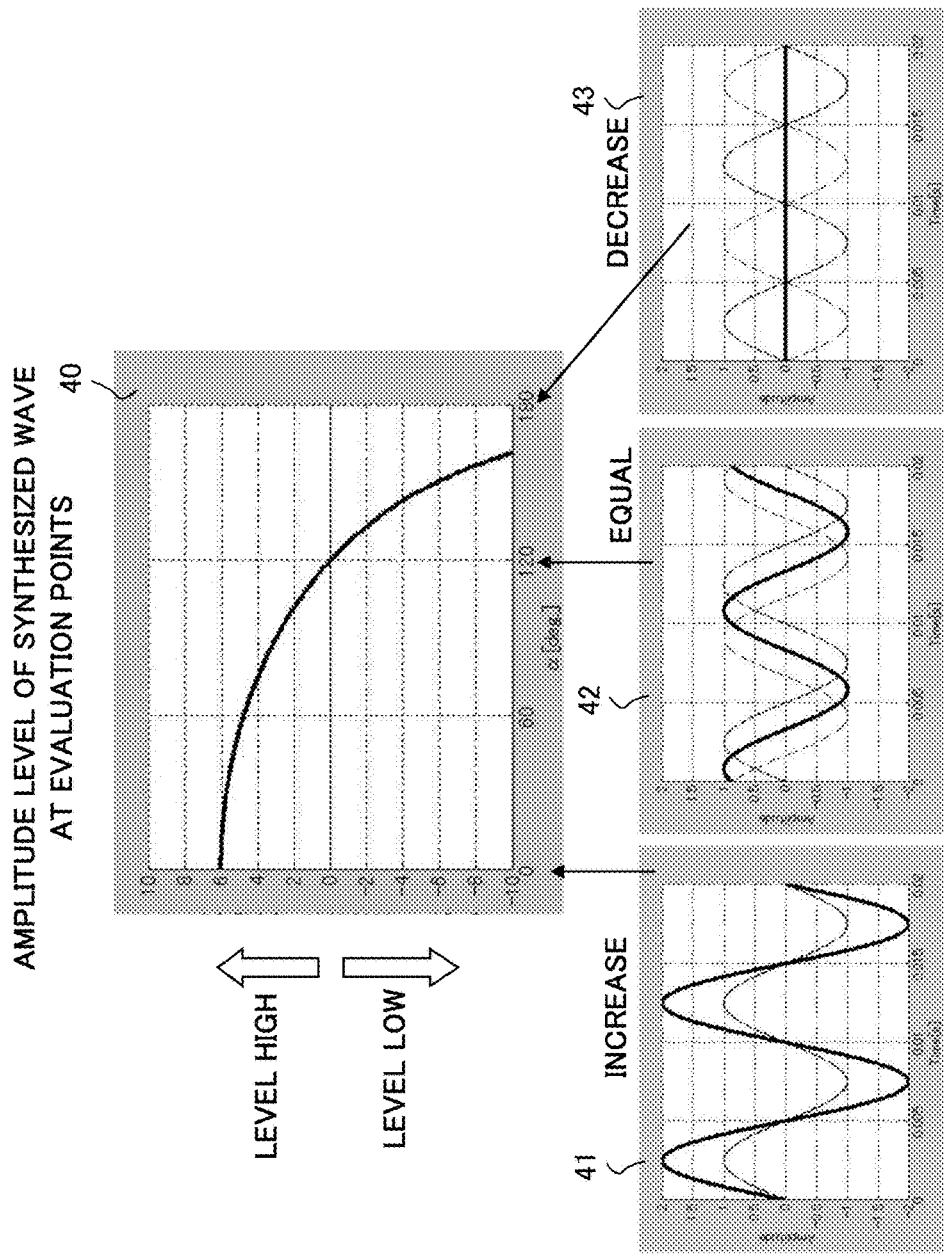
FIG. 5 illustrates amplitude levels of a synthesized wave obtained by synthesizing two sine waves with a different phase difference.

This is because, if the amplitude of SP1 and SP2 are generally the same at the evaluation point and the value $\alpha$ is within this range, the both-ear level sum becomes smaller than that in a case where the sound is outputted only one of the front and rear speakers. This will be described with reference to FIG. 5. FIG. 5 illustrates the amplitude level of the synthesized wave obtained by synthesizing two sine waves with a different phase. When two sine waves are synthesized in phase (the phase difference=0), the amplitude of the synthesized wave becomes twice of the original sine wave as shown by the graph 41. When two sine waves are synthesized with the phase difference 120°, the amplitude of the synthesized wave becomes equal to the amplitude of two sine waves as shown by the graph 42. On the other hand, when two sine waves are synthesized in reverse phase (the phase difference=180°), the amplitude of the synthesized wave becomes smaller than the amplitude of the original sine wave as shown by the graph 43.

As shown by the graph 40, when the phase difference ranges between 120°-180°, the amplitude of the synthesized wave of two sine waves becomes at least equal to or smaller than the amplitude of the original sine wave. Therefore, the both-ear level sum at the listening position becomes smallest when the phase difference given to the signals supplied to two speakers is α=180° (in reverse phase), i.e., θ(f)=A. However, if α is within the range of ±60° from the phase at that time, the both-ear level sum can be made at least smaller than the case where the sound is reproduced only one of the front and rear speakers. For this reason, the value α is set to the range of ±60°.

Figure 3B:
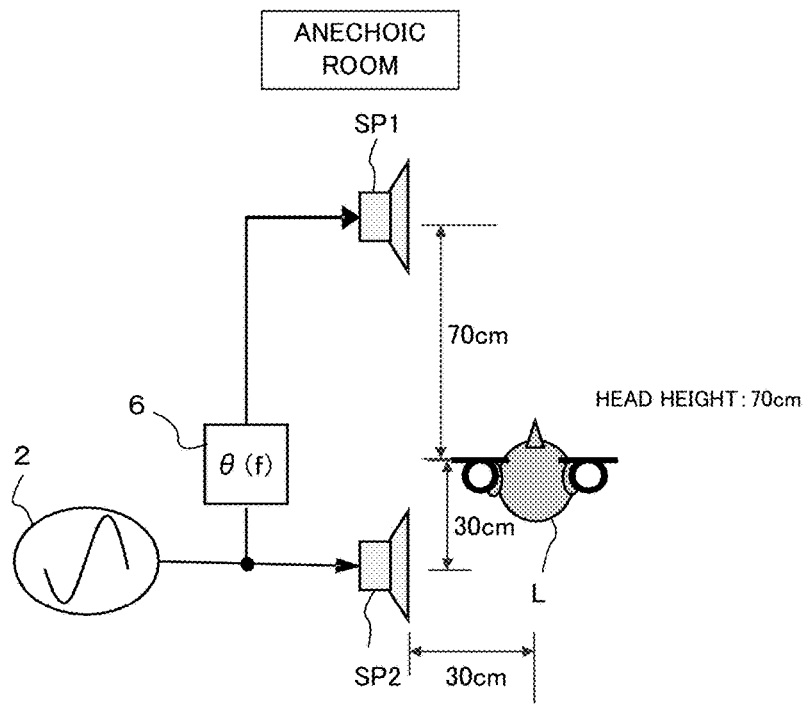
Figure 6A:
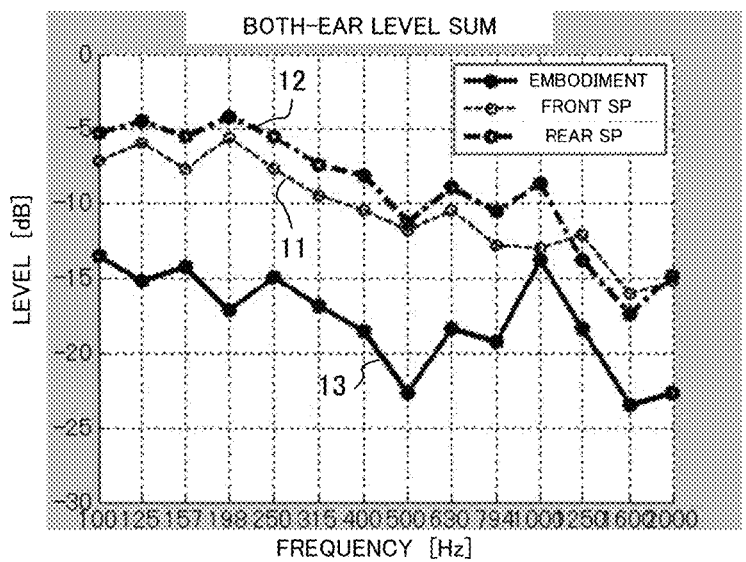
FIGS. 6A and 6B are diagrams illustrating characteristics in the first embodiment.
Figure 6B:
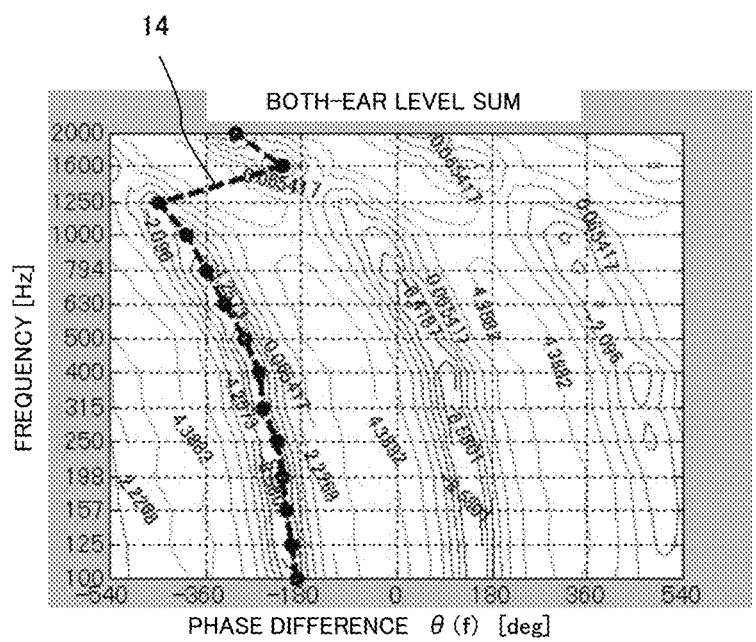

Now, FIGS. 6A and 6B illustrate characteristics when the phase shift amount A calculated by the equation (1) is given as the phase difference θ (f) by the phase correction unit 6 in the example of the arrangement shown in FIG. 3B. It is noted that the arrangement shown in FIG. 3B is the example in which the listener sits on the assistant driver's seat of a standard sedan-type vehicle.

Specifically, FIG. 6A illustrates frequency characteristics of the both-ear level sum. In FIG. 6A, the graph 11 illustrates the both-ear level sum when the sound signal is inputted only to the front speaker SP1. The graph 12 illustrates the both-ear level sum when the sound signal is inputted only to the rear speaker SP2. The graph 13 illustrates the both-ear level sum when the sound signals are inputted to two speakers and the phase shift amount A calculated by the equation (1) is given to those sound signals as the phase difference θ(f).

The both-ear level sum (graph 13) obtained when the sound signals are inputted to two speakers with the phase difference is smaller, in the entire frequency band 100 Hz-2 kHz, than the both-ear level sum (graph 11) obtained when the sound signal is inputted only to the front speaker SP1 and the both-ear level sum (graph 12) obtained when the sound signal is inputted only to the rear speaker SP2. Therefore, in order to make the both-ear level sum small at the evaluation points, it is necessary to input the sound signals to two speakers with an appropriate phase difference as shown by the graph 13.

FIG. 6B illustrates relation of the phase difference given to the sound signals inputted to two speakers and the frequency of the sound signals with respect to the both-ear level sum. The broken line 14 shown in FIG. 6B illustrates the both-ear level sum obtained when the sound signals are inputted to two speakers and the phase shift amount A calculated by the equation (1) is given to the sound signals as the phase difference θ (f). The broken line 14 passes through the area where the both-ear level sum is small (negative value) in the entire frequency band. Namely, FIG. 6A also shows that, in order to make the both-ear level sum small at the evaluation points, it is necessary to give an appropriate phase difference to the sound signals inputted to two speakers SP1 and SP2.

Figure 7A:
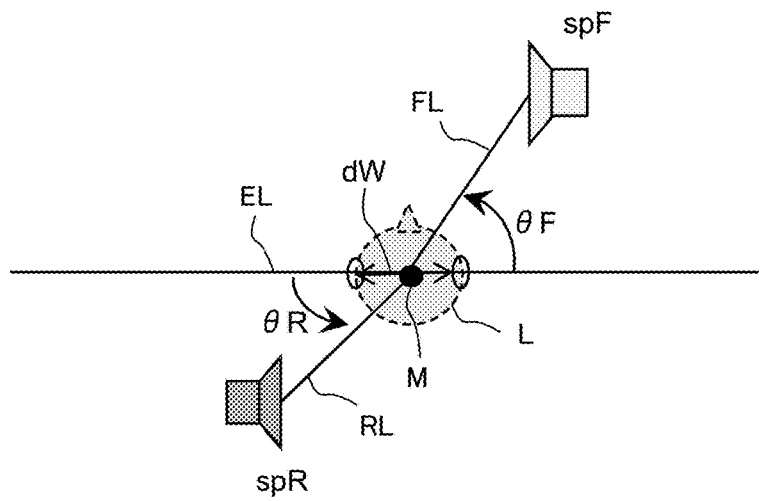
FIGS. 7A and 7B illustrate a method of determining an upper limit frequency of a controlled frequency band.

Next, description will be given of an upper limit frequency of the frequency band (hereinafter referred to as "controlled band") in which the both-ear level sum can be made small by the first embodiment. FIG. 7A illustrates an equation for calculating the upper limit frequency of the controlled band and its environment. As illustrated, a front speaker spF and a rear speaker spR are arranged in front of and behind the listener L. The distance between the positions of both ears (corresponding to the evaluation points), i.e., the width of the both ears is expressed as "dW". The angle formed by a line segment FL connecting the center position M of the ear positions of the listener L with the front speaker spF and a line segment EL connecting the positions of both ears of the listener L is expressed as "θF". Also, the angle created by a line segment RL connecting the center position M of the ear positions of the listener L with the rear speaker spR and the line segment EL connecting the positions of both ears of the listener L is expressed as "θR". Here, if the sound velocity is expressed as "c", the upper limit frequency of the controlled band is given by the following equation:

$$fu = c/dW/3/(|\cos \theta F + \cos \theta R|) \qquad (4)$$

It is noted that the listening position has a sufficient distance from each speakers, and the wave of the reproduced sound is regarded as a plane wave for simplicity, Now, it is supposed that the ear width dW of the listener L is 17 cm as a head width of a standard human being. In this case, the upper limit frequency becomes as follows dependently upon the above angles θF and θR.

(Example 1)
  If θF and θR≈0°, fu≈333 Hz.
(Example 2)
  If θF≈0° and θR=90°, fu≈333 Hz.
(Example 3)
  If θF and θR=90° (With respect to two evaluation points, the front speaker is right in front and the rear speaker is right behind), fu≈∞ (infinity) Hz.
(Example 4)
  If θF≈0° and θR=180°, fu≈∞ (infinity) Hz in theory. However, actually two speakers are aligned on the same straight line in the same direction and there is no interference fringe, and therefore it is uncontrollable.

Figure 7B:
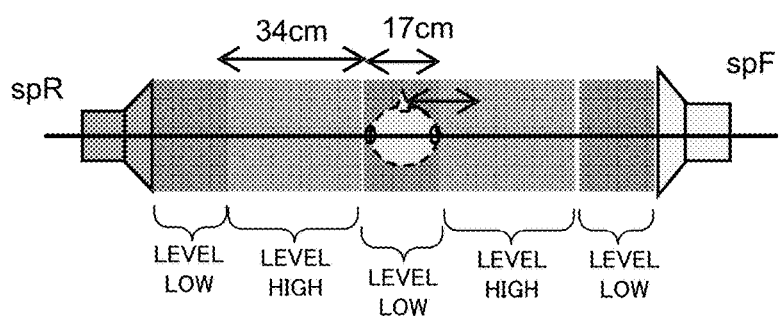

As described above, supposing that the ear width dW of the listener L is 17 cm, the upper limit frequency fu of the controlled band is 333 Hz in the Example 1. FIG. 7B illustrates the interference fringes created around the head of the listener L in this case. In the Example 1, two speakers spF and spR are arranged on the same straight line in a manner opposite to each other, and the interference fringes are created between those speakers. The level of the interference fringes becomes high at the area where the sound waves from two speakers strengthen each other and becomes low at the area where the sound waves weaken each other. In order to make the both-ear level sum small in this embodiment, the head of the listener L (i.e., two evaluation points) must fall within a single low-level area. In case of the upper limit frequency fu=333 Hz, the head (width 17 cm) of the listener L just falls within the low-level area as shown in FIG. 7B.

If the frequency f is higher than 333 Hz, the width of a single low-level area becomes smaller than 17 cm and the both ears (two evaluation points) of the listener L do not fall within a single low-level area, and therefore the both-ear level sum of the listener L cannot be made small. On the other hand, if the frequency f is lower than 333 Hz, the width of a single low-level area becomes larger than 17 cm and the both ears (two evaluation points) of the listener L fall within a single low-level area, and therefore the both-ear level sum of the listener L can be made small. Accordingly, supposing that the ear width (distance between two evaluation points) of the listener L is 17 cm, the upper limit frequency fu in this embodiment becomes 333 Hz, and it is possible to make the both-ear level sum small for the reproduced sound in the frequency band equal to or lower than this upper limit frequency fu. It is noted that the lower limit frequency of the controlled band is around 10 Hz, which is the lower limit of audible frequency range of a human being.

[2nd Embodiment]

Figure 8:
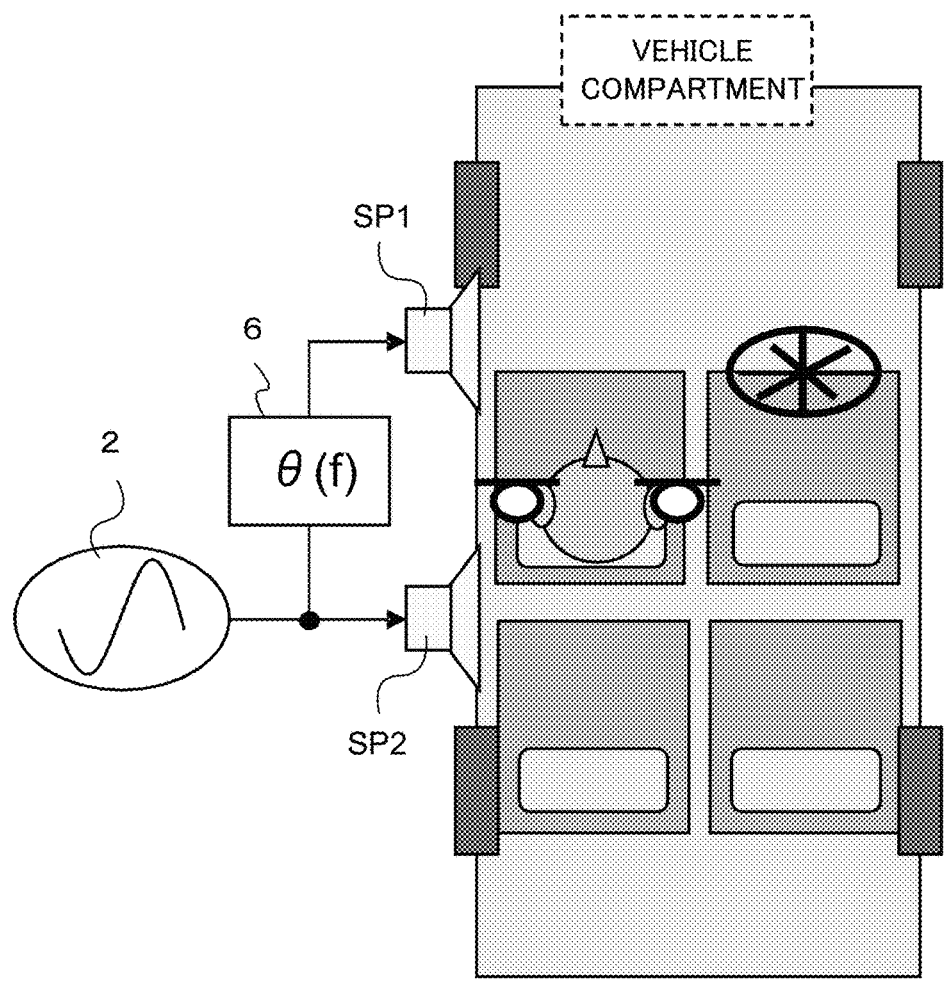
FIG. 8 illustrates a schematic configuration of a second embodiment of the volume control device according to the present invention.

Next, the second embodiment will be described. FIG. 8 illustrates a schematic configuration of the second embodiment of the volume control device. In the second embodiment, it is supposed that the acoustic space is a vehicle compartment. As shown in FIG. 8, a front speaker SP1 and a rear speaker SP2 are arranged on the left side of the assistant driver's seat. The sound signal from the sound source 2 is supplied to the rear speaker SP2, and also supplied to the front speaker SP1 after its phase is corrected by the phase correction unit 6. Similarly to the first embodiment, the phase correction unit 6 gives the phase difference (phase correction value) θ (f) different for each frequency band of the sound signal.

Similarly to the first embodiment, the phase difference θ (f) is set as follows:

$$\theta (f) = A + \alpha \qquad (2)$$

Here, "A" is the phase shift amount which makes the both-ear level sum of the listener minimum, and it is calculated based on the transfer function between two speakers and two evaluation points in the second embodiment. Specifically, the transfer functions between the respective speakers and the both ears of the listener are obtained based on the positional relation between two speakers SP1, SP2 and the both ears (evaluation points) of the listener. Then, based on the transfer functions, the distribution of the both-ear level sum with respect to the phase and the frequency is generated by simulation or else as shown in FIG. 9B. On the distribution, the line segment connecting the areas having the lowest both-ear level sum (the line segment 24 in FIG. 9B) indicates the phase difference θ (f) for each frequency band.

Figure 9A:
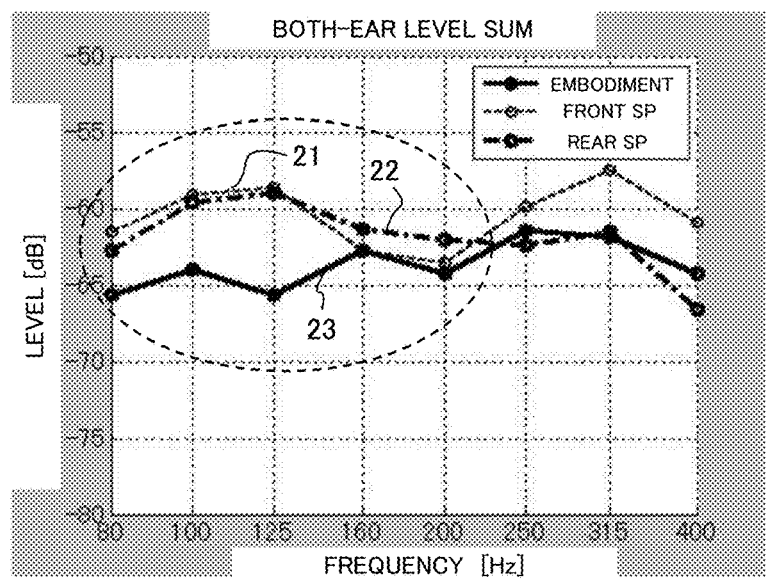
FIGS. 9A and 9B are diagrams illustrating characteristics in the second embodiment.
Figure 9B:
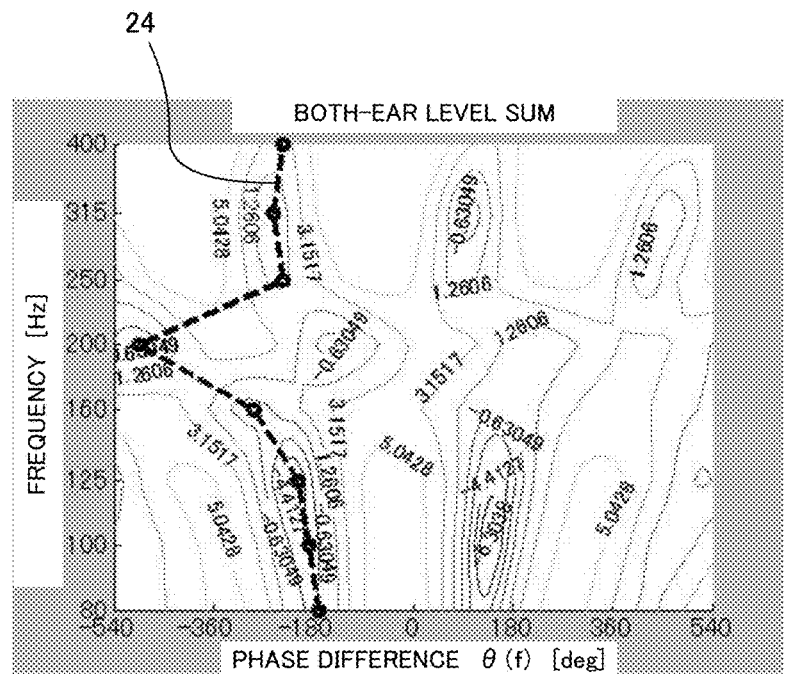

FIGS. 9A and 9B illustrates characteristics when the phase correction unit 6 gives the phase shift amount A calculated as described above as the phase difference θ (f) in the arrangement shown in FIG. 8. It is noted that the arrangement shown in FIG. 8 is the example in which the listener sits on the assistant driver's seat of a standard sedan-type vehicle.

Specifically, FIG. 9A illustrates a frequency characteristic of the both-ear level sum. In FIG. 9A, the graph 21 shows the both-ear level sum when the sound signal is inputted only to the front speaker SP1. The graph 22 shows the both-ear level sum when the sound signal is inputted only to the rear speaker SP2. The graph 23 shows the both-ear level sum when the sound signals are inputted to two speakers, and the phase shift amount A calculated as described above is given to the sound signals as the phase difference θ (f).

The both-ear level sum (graph 23) obtained when the sound signals are inputted to two speakers with the phase difference is smaller, in the frequency band equal to or lower than 200 Hz, than the both-ear level sum (graph 21) obtained when the sound signal is inputted only to the front speaker SP1 and the both-ear level sum (graph 22) obtained when the sound signal is inputted only to the rear speaker SP2. Therefore, in order to make the both-ear level sum small at the evaluation points, it is necessary to input the sound signals to two speakers with an appropriate phase difference as shown by the graph 23.

FIG. 9B illustrates the relation of the both-ear level sum with respect to the phase difference given to the sound signals inputted to two speakers and the frequency of the sound signals. The broken line 24 shown in FIG. 9B indicates the both-ear level sum obtained when the sound signals are inputted to two speakers and the phase shift amount A calculated as described above is given to the sound signals as the phase difference θ (f). The broken line 24 passes through the areas where the both-ear level sum is small (negative value) in the entire frequency band. Namely, FIG. 9B also shows that, in order to make the both-ear level sum small at the evaluation points, it is necessary to give an appropriate phase difference to the sound signals inputted to two speakers SP1 and SP2.

In the method of the second embodiment, while the sound is reproduced from two speakers SP1 and SP2, the influence to the passenger at the rear seat is small. Namely, the passenger at the rear seat does not feel that the reproduced sound is small. This is because, since the rear seat is located outside two speakers, the reproduced sounds from two speakers hardly synchronize with each other. This will be described with reference to FIG. 10.

Figure 10A:
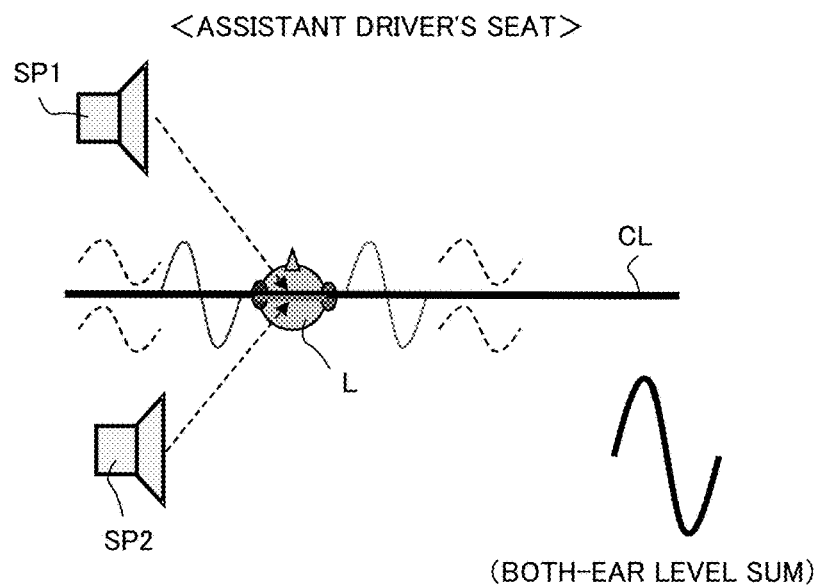
FIGS. 10A and 10B illustrate a relation between an axis on which reproduced sound from two speakers synchronize and a listening position.
Figure 10B:
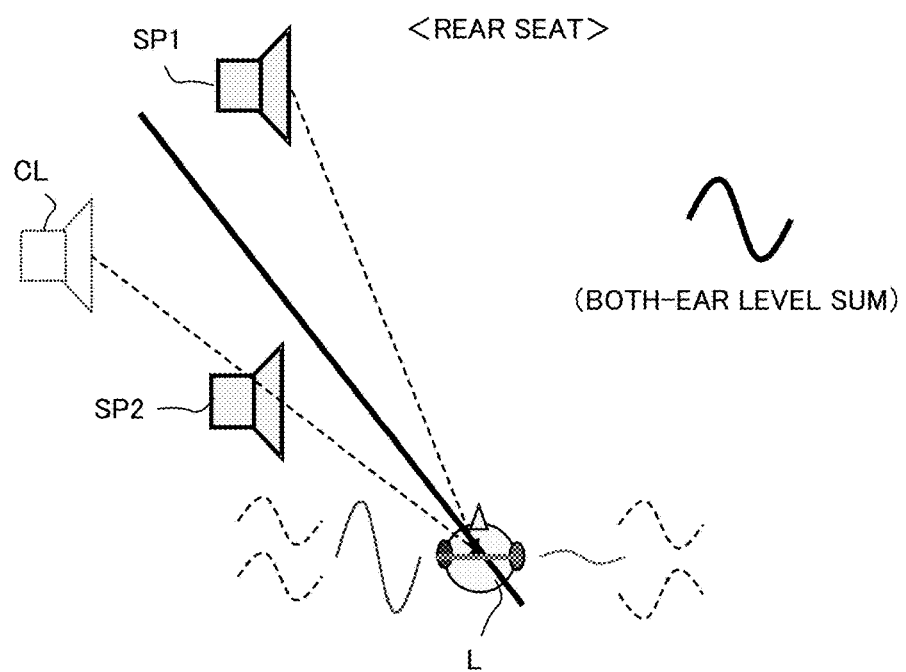

FIGS. 10A and 10B show the positional relation between two speakers and the listener L. As shown in FIG. 10A, when the sounds are reproduced from two speakers SP1 and SP2, the axis on which the reproduced sounds from two speakers synchronize with each other is the center line CL of two speakers. When the listener L is located inside two speakers, the both ears of the listener L exist on or near the center line CL. Therefore, the reproduced sounds reaching the both ears synchronize with each other and the both-ear level sum easily varies.

On the contrary, as shown in FIG. 10B, when the listener L is located outside two speakers SP1 and SP2, even if the listener L exists on the center line CL on which the reproduced sounds from two speakers synchronize with each other, the both-ear level sum hardly varies because the direction connecting the both ears of the listener deviates from the center line CL. Therefore, in the second embodiment, even if the sounds are reproduced by the front speaker SP1 and the rear speaker SP2 such that the both-ear level sum becomes small at the assistant driver's seat, the passenger at the rear seat does not feel that the reproduced sound is small.

Figure 11:
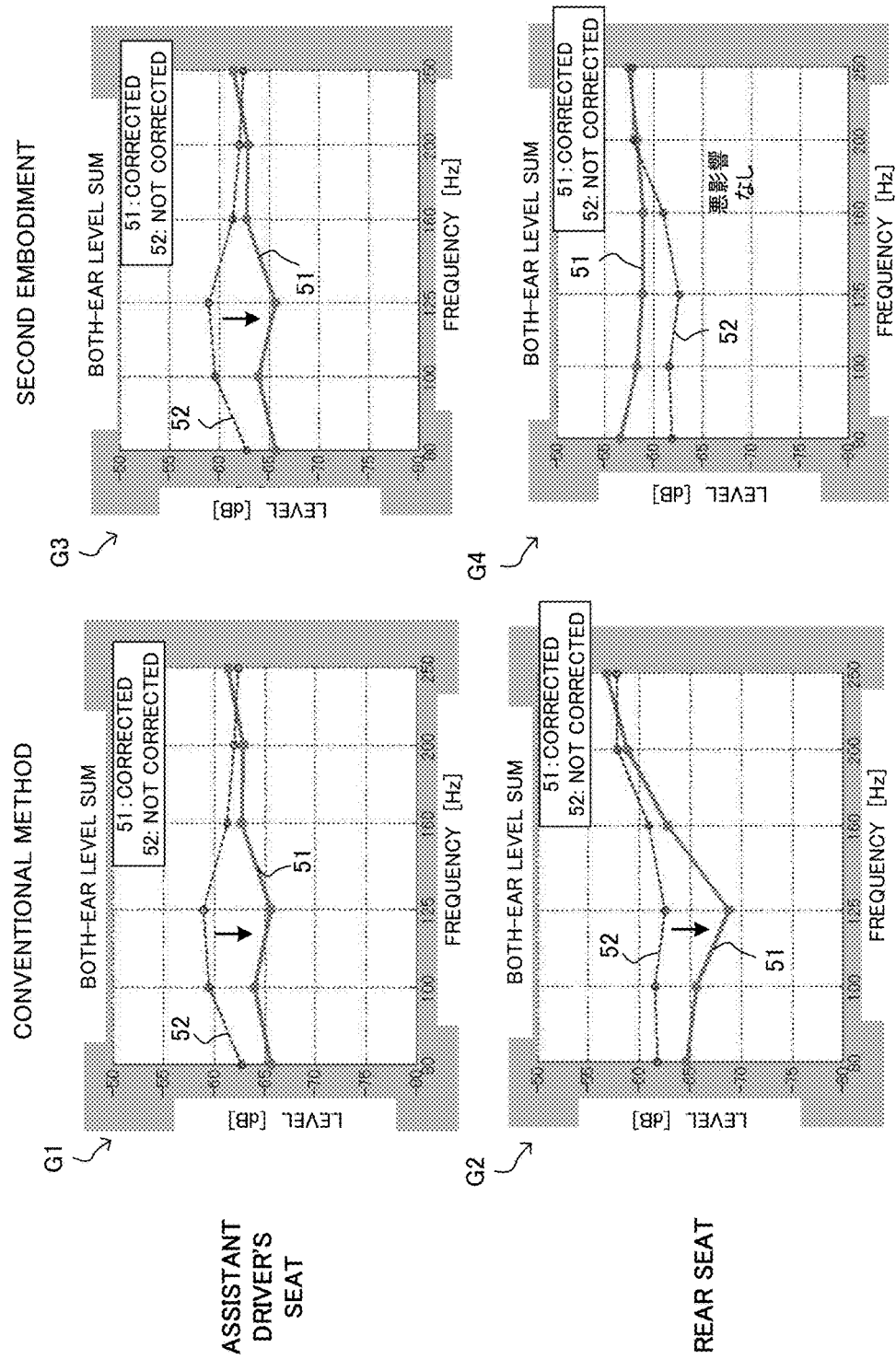
FIG. 11 illustrates effect of the second embodiment in comparison with a conventional method.

FIG. 11 is a diagram for explaining effect of the second embodiment in comparison with the conventional method. Here, the conventional method is to perform correction by decreasing the reproduced sound from the rear speaker at a certain frequency band by an equalizer to attenuate the both-ear level sum at the assistant driver's seat.

As shown by the graphs G1 and G2 on the left of FIG. 11, when the both-ear level sum at the assistant driver's seat is attenuated by the conventional method, the both-ear level sum also becomes small at the rear seat and the reproduced sound at the rear seat becomes small. In contrast, as shown by the graphs G3 and G4 on the right side of FIG. 11, when the both-ear level sum is attenuated at the assistant driver's seat by the method of the second embodiment, the both-ear level sum at the rear seat does not vary as described above, and there occurs no such disadvantage that the reproduced sound at the rear seat becomes small. Thus, according to the second embodiment, it is possible to decrease the reproduced sound level at the assistant driver's seat without affecting the reproduced sound level at other seats.

In the second embodiment described above, the both-ear level sum at the assistant driver's seat, i.e., the front seat on the left side is made small by using the front speaker and the rear speaker arranged on the left side of the vehicle compartment. However, by the similar method, the both-ear level sum at the driver's seat, i.e., the front seat on the right side may be made small by using the front speaker and the rear speaker arranged on the right side of the vehicle compartment.

[Modified Example]

In the embodiments described above, the frequency bands of the sound signal are divided by ⅓ octave, and the phase shift amount A for each frequency band is calculated by using the center frequency f of the frequency band. For example, the processing shown in FIGS. 6A, 6B, 9A and 9B calculates the phase shift amount A by using the center frequency of each frequency band divided by ⅓ octave, and applies the phase shift amount A for each frequency band to control the sound signal. Specifically, to the frequency band of 111 Hz-140 Hz having the center frequency 125 Hz, the phase shift A calculated by using the center frequency 125 Hz is given.

To the frequency band of 140 Hz-176 Hz having the center frequency 157 Hz, the phase shift amount A calculated by using the center frequency 157 Hz is given. The reason why the frequency bands are divided by ⅓ octave is that smoothing a characteristic by ⅓ octave is generally understood to be similar to an auditory processing.

However, in the present invention, the manner of dividing the frequency bands of the sound signal is not limited to the dividing by ⅓ octave, and it is enough that the phase shift amount calculated by using the center frequency is given to the frequency bands divided with a certain interval. Namely, the frequency bands of the sound signal may be divided by ½ octave or ¼ octave. Alternatively, the phase shift may be given to each frequency (e.g., the phase shift 50°, 51°, 52°, . . . maybe given to the frequency 100 Hz, 101 Hz, 102 Hz, . . . ).

INDUSTRIAL APPLICABILITY

This invention can be used for a volume control device loaded on a vehicle or the like.

DESCRIPTION OF REFERENCE NUMERALS

2 Sound Source
3 Dummy Head
6 Phase Correction Unit
SP1 Front Speaker
SP2 Rear Speaker
L Position of Listener

The invention claimed is:

1. A volume control device connected to a pair of speakers arranged in front of and behind a listening position in an acoustic space, comprising:
a phase controller configured to give a phase difference, at a frequency lower than a predetermined frequency, between a first sound signal to be supplied to the speaker in front of the listening position and a second sound signal to be supplied to the speaker behind the listening position, and to output the first and second sound signals to the pair of speakers,
wherein the phase controller is further configured to calculate the phase difference based on distances between the listening position and positions of the pair of speakers or based on transfer functions between the pair of speakers and two evaluation points of the listening position, and
wherein the phase controller is further configured to calculate the predetermined frequency based on a distance between the two evaluation points and angles formed by a line segment connecting the two evaluation points and line segments connecting the center of the two evaluation points and each of the pair of speakers, and
wherein the phase controller makes, by using the phase difference, a reproduced sound level at the listening position when the sound signals with the phase difference are reproduced by the pair of speakers become smaller than a reproduced sound level at the listening position when the sound signal is reproduced by either one of the pair of speakers with no phase difference.

2. The volume control device according to claim 1,
wherein the listening position includes the two evaluation points, and
wherein the reproduced sound level at the listening position is a sum of the reproduced sound levels at the two evaluation points.

3. The volume control device according to claim 2, wherein the predetermined frequency fu is given by:

$$fu = c/(dW*3*(|\cos \theta F + \cos \theta R|)),$$

wherein "dW" is a distance between the two evaluation points, "θF" is an angle formed by a line segment connecting a center of the two evaluation points and the speaker in front of the listening position and a line segment connecting the two evaluation points, "θR" is an angle formed by a line segment connecting the center of the two evaluation points and the speaker behind the listening position and the line segment connecting the two evaluation points, and "c" is a sound velocity.

4. The volume control device according to claim 3, wherein the predetermined frequency is 333 Hz.

5. The volume control device according to claim 1, wherein the phase controller gives, to the sound signal, the phase difference within ±60° from the phase at which a sum of the reproduced sound levels becomes minimum.

6. The volume control device according to claim 1, wherein the phase difference is calculated based on the distance between the listening position and positions of the pair of speakers.

7. A volume control method executed by a volume control device connected to a pair of speakers arranged in front of and behind a listening position in an acoustic space, comprising:
a phase control process, executed by a phase controller, which gives a phase difference, at a frequency lower than a predetermined frequency, between a first sound signal to be supplied to the speaker in front of the listening position and a second sound signal to be supplied to the speaker behind the listening position, and to output the first and second sound signals to the pair of speakers,
wherein the phase control process calculates the phase difference based on distances between the listening position and positions of the pair of speakers or based on transfer functions between the pair of speakers and two evaluation points of the listening position, and
wherein the phase control process calculates the predetermined frequency based on a distance between the two evaluation points and angles formed by a line segment connecting the two evaluation points and line segments connecting the center of the two evaluation points and each of the pair of speakers, and
wherein the phase control process makes, by using the phase difference, a reproduced sound level at the listening position when the sound signals with the phase difference are reproduced by the pair of speakers become smaller than a reproduced sound level at the listening position when the sound signal is reproduced by either one of the pair of speakers with no phase difference.

8. A non-transitory computer-readable medium storing a volume control program and executed by a computer in a volume control device connected to a pair of speakers arranged in front of and behind a listening position in an acoustic space, the program causing the computer to function as:
- a phase controller configured to give a phase difference, at a frequency lower than a predetermined frequency, between a first sound signal to be supplied to the speaker in front of the listening position and a second sound signal to be supplied to the speaker behind the listening position, and to output the first and second sound signals to the pair of speakers,
- wherein the phase controller is further configured to calculate the phase difference based on distances between the listening position and positions of the pair of speakers or based on transfer functions between the pair of speakers and two evaluation points of the listening position,
- wherein the phase controller is further configured to calculate the predetermined frequency based on a distance between the two evaluation points and angles formed by a line segment connecting the two evaluation points and line segments connecting the center of the two evaluation points and each of the pair of speakers, and
- wherein the phase controller makes, by using the phase difference, a reproduced sound level at the listening position when the sound signals with the phase difference are reproduced by the pair of speakers become smaller than a reproduced sound level at the listening position when the sound signal is reproduced by either one of the pair of speakers with no phase difference.

9. The volume control device according to claim 2, wherein the predetermined frequency is calculated based on a distance between the two evaluation points and a positional relation between the two evaluation points and the pair of speakers.

10. The volume control device according to claim 2,
- wherein the phase difference is calculated based on transfer functions between the pair of speakers and the two evaluation points, and
- wherein the predetermined frequency is calculated based on the phase difference as an upper limit frequency that reduces the sum of the reproduced sound levels.

* * * * *